(12) United States Patent
Wang

(10) Patent No.: US 6,753,796 B2
(45) Date of Patent: Jun. 22, 2004

(54) CONVERSION CIRCUIT FOR BURST SIGNALS REFERENCING TO VARIOUS CLOCKS AND METHOD FOR THE SAME

(75) Inventor: Tse-Hsien Wang, Taipei (TW)

(73) Assignee: Via Technologies, Inc., Taipei (TW)

(*) Notice: Subject to any disclaimer, the term of this patent is extended or adjusted under 35 U.S.C. 154(b) by 0 days.

(21) Appl. No.: 10/617,720

(22) Filed: Jul. 14, 2003

(65) Prior Publication Data

US 2004/0032349 A1 Feb. 19, 2004

(30) Foreign Application Priority Data

Aug. 14, 2002 (TW) .......................................... 091118229

(51) Int. Cl.$^7$ .............................................. H03M 7/00
(52) U.S. Cl. ............................................ 341/50; 710/35
(58) Field of Search .................. 341/50, 111; 712/207; 710/35, 70

(56) References Cited

U.S. PATENT DOCUMENTS

| | | | | |
|---|---|---|---|---|
| 4,476,558 A | * | 10/1984 | Arnon ......................... | 370/294 |
| 4,797,730 A | * | 1/1989 | Smith ......................... | 348/539 |
| 5,406,335 A | * | 4/1995 | Nikoh ......................... | 348/642 |
| 6,151,356 A | * | 11/2000 | Spagnoletti et al. ......... | 375/226 |
| 6,330,391 B1 | * | 12/2001 | Kurihara et al. ............. | 386/21 |

\* cited by examiner

*Primary Examiner*—Peguy JeanPierre
(74) *Attorney, Agent, or Firm*—Rosenberg, Klein & Lee

(57) ABSTRACT

A conversion circuit is devised to convert burst signals referencing to a plurality of clocks, respectively. A burst signal referencing to a first clock is decomposed into a plurality of non-burst signals by a plurality of phase signal generators and corresponding signal fetching units. The plurality of non-burst signals are converted to signals referencing a second clock by a plurality of converters and those signals are synthesized into an output signal by a synthesizer. Therefore, the burst signal referencing to the first clock can be converted to the burst signal referencing to the second clock.

21 Claims, 6 Drawing Sheets

US 6,753,796 B2

CONVERSION CIRCUIT FOR BURST SIGNALS REFERENCING TO VARIOUS CLOCKS AND METHOD FOR THE SAME

FIELD OF THE INVENTION

The present invention relates to a conversion circuit for burst signals and method for the same, especially to a conversion circuit for burst signals referencing to various clocks and method for the same.

BACKGROUND OF THE INVENTION

Due to the fast development of computer technologies and the processing requirement of sophisticated software, the internal frequency of central processing unit (CPU) is rapidly increased. Correspondingly, the modern computer is tiered to several hierarchies in terms of clock rate in order to exploit optimal efficiency for each component thereof. Therefore, a motherboard preferably provides several kinds of clock signals to meet the requirement of different operation frequencies in those hierarchies. For example, if the external frequency (motherboard speed) of a CPU is 133 MHz, the internal frequency of the CPU may be 1.6 GHz, the frequency of the front-side bus (processor bus) may be 533 MHz, and the frequency of the memory bus and the IDE bus may be slower 100 MHz. Therefore, it is a challenging issue to provide a robust and efficient interface for signal conversion and transmission among those device with different clock rates.

The above problem is even worse in a computer adopting burst mode for data transmission, which is developed to enhance data transmission efficiency among the components of a computer. Due to the consecutive nature of burst signals, the sampling is difficult for signal transmitted from component with different clock rates. More particularly, the problem of signal lost or duplication is probable to occur due to the difficulty of counting the number of independent signals in a burst signal.

FIG. 1 shows a block diagram of a conventional conversion circuit adapted for systems with different clock rates, i.e. a first system 120 with a first clock CLK1 and a second system 140 with a second clock CLK2. The conversion circuit comprises a signal receiver 123 and a first counter 125 in the first system 120, and a signal generator 143 and a second counter 145 in the second system 140.

When a burst signal SIG1 referencing to the first clock CLK1 is to be sent from the first system 120 to the second system 140, the burst signal SIG1 is firstly sent to the signal receiver 123 from the first system 120. The first counter 125 counts the number of the independent signals (how many clock cycles) in the burst signal SIG1 with reference to the first clock CLK1 and sends the counting result CNT 1 of the burst signal SIG1 to the second counter 145. The second counter 145 counts the counting result CNT 1 with reference to the second clock CLK2 and has increased count only when the second counter 145 senses the increment of the counting result CNT 1 at the rising edge of the second clock CLK2.

The signal generator 143 is triggered by an increment in the counting result CNT 2 of the second counter 145 to generate a signal SIG2 referencing to the second clock CLK2 for the second system 140.

However, the conventional conversion circuit requires the provision of the signal receiver, the signal generator, and the counters for those systems, the cost is high. Moreover, the signal generator may have wrong sampling over the signal receiver due to clock rate difference in both systems.

SUMMARY OF THE INVENTION

It is an object of the present invention to provide a method for converting burst signals referencing to various clocks, wherein a burst signal is decomposed into a plurality of non-burst signals, the non-burst signals are converted to signals referencing to another clock rate and then the signals are combined to form desired output signal.

It is another object of the present invention to provide a conversion circuit for signals referencing to various clocks, which comprises a plurality of phase signal generators and a plurality of signal fetching units to fast decompose a burst signal to a plurality of non-burst signals.

It is still another object of the present invention to provide a conversion circuit for signals referencing to various clocks, which uses phase signal consisting of cyclic high-level signal and low-level signal and AND gate to decompose the burst signal.

It is still another object of the present invention to provide a conversion circuit for signals referencing to various clocks, which uses an OR gate to combine a plurality of converted non-burst signals into desired output signal.

The various objects and advantages of the present invention will be more readily understood from the following detailed description when read in conjunction with the appended drawing, in which:

DETAILED DESCRIPTION OF THE INVENTION

Figure 1:
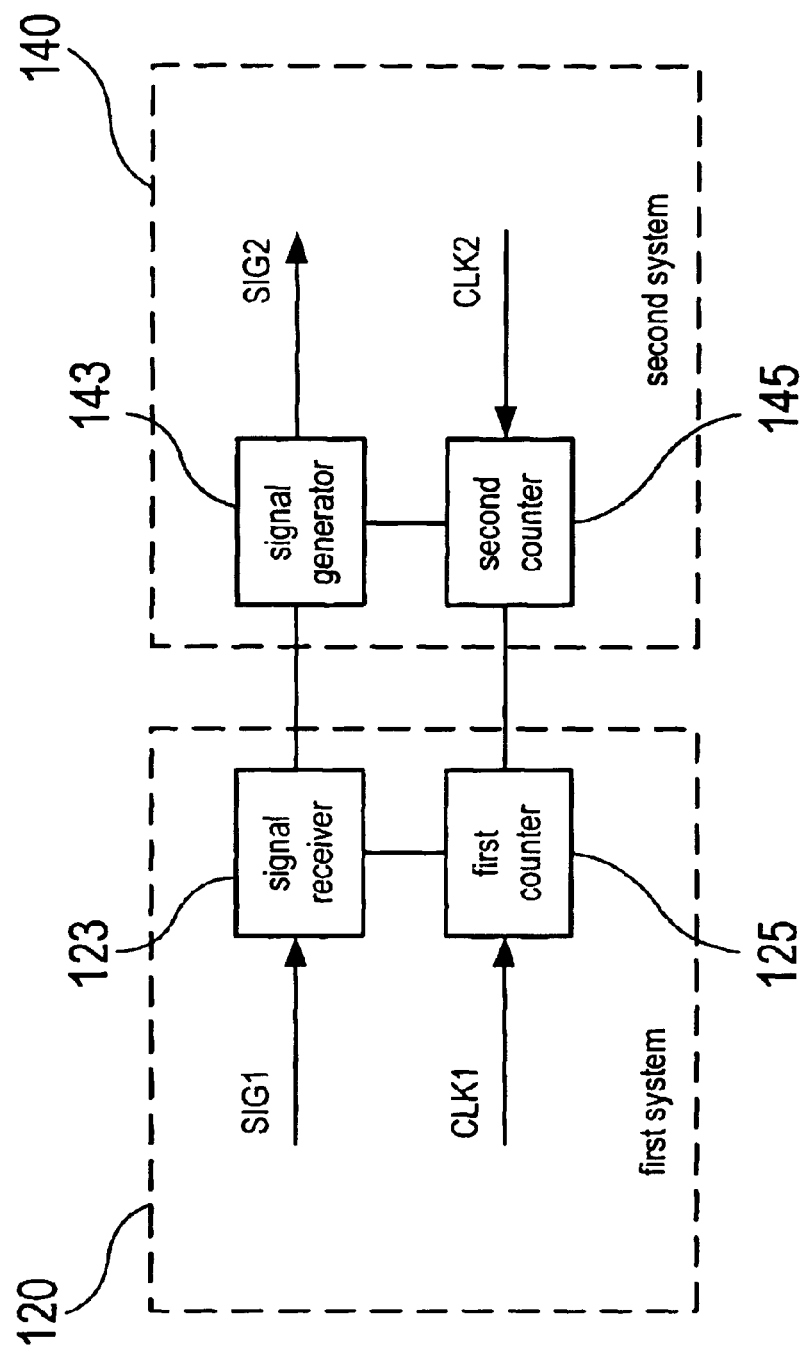
FIG. 1 shows a block diagram of prior art conversion circuit for burst signal.
Figure 2:
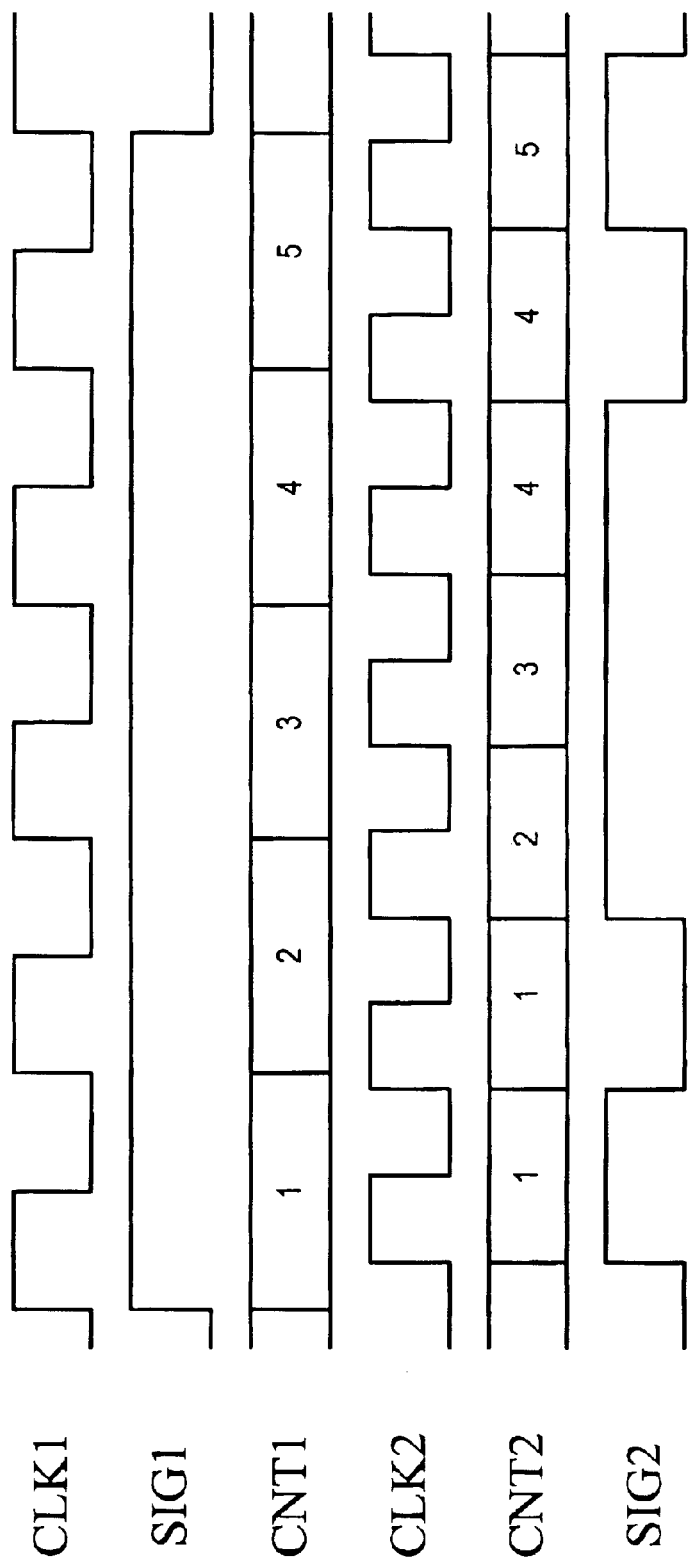
FIG. 2 is a waveform diagram showing the conversion of burst signal in prior art conversion circuit.
Figure 3:
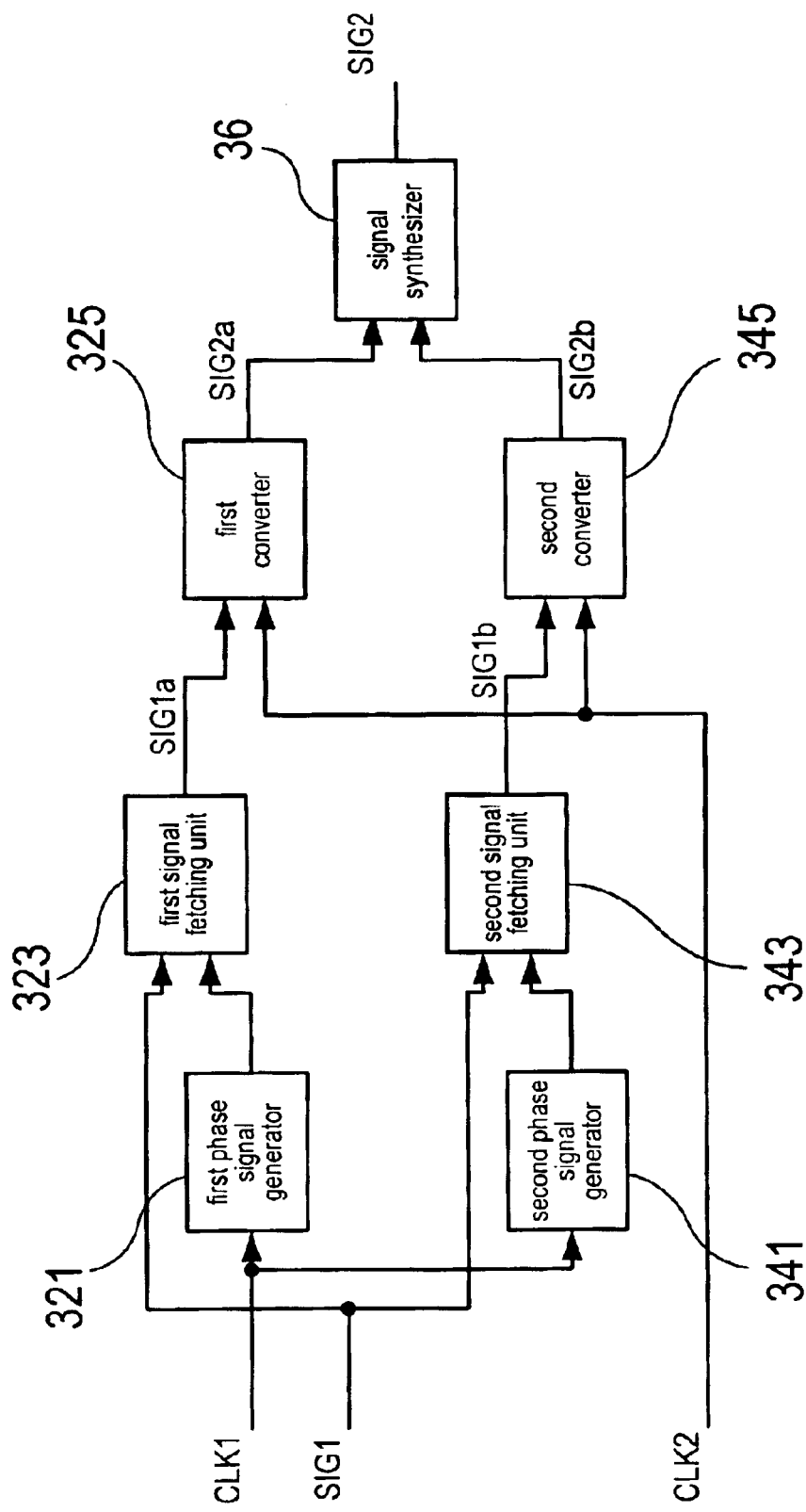
FIG. 3 shows a block diagram of a preferred embodiment of the present invention.

FIG. 3 shows a block diagram of a preferred embodiment according to the present invention. The conversion circuit according to the preferred embodiment comprises a first phase signal generator 321, a second phase signal generator 341, a first signal fetching unit 323, a second signal fetching unit 343, a first converter 325, a second converter 345 and a signal synthesizer 36. The conversion circuit provides signal conversion between a first system with a first clock CLK1 and a second system with a second clock CLK2.

Each of the first phase signal generator 321 and the second phase signal generator 341 has an input connected to receive the first clock signal CLK1 of the first system and generates a first phase signal PHa and a second phase signal PHb, respectively. The first signal fetching unit 323 is connected to receive a burst signal SIG1 referencing to the first clock CLK1 and the first phase signal Pha. The second signal fetching unit 343 is connected to receive the burst signal SIG1 referencing to the first clock CLK1 and the second phase signal PHb. The first signal fetching unit 323 processes the burst signal SIG1 with reference to the first phase signal PHa and generates a first-clock-based first non-burst signal SIG1a. The second signal fetching unit 343 processes the burst signal SIG1 with reference to the second phase signal PHb and generates a first-clock-based second non-burst signal SIG1b. More particularly, the first phase signal PHa is complementary to the second phase signal PHb such that the burst signal SIG1 can be decomposed into two non-burst signals by the first signal fetching unit 323 and the second signal fetching unit 343.

The first non-burst signal SIG1a and the second non-burst signal SIG1b are sent to the first converter 325 and the second converter 345, respectively. The first converter 325 converts the first non-burst signal SIG1a into a second-clock-based signal SIG2a with reference to the second clock CLK2. The second converter 345 converts the second non-burst signal SIG1b into a second-clock-based signal SIG2b with reference to the second clock CLK2. The signal SIG2a and the signal SIG2b are then combined by the signal synthesizer 36 to form a converted signal SIG2 referencing to the second clock CLK 2.

Figure 4:
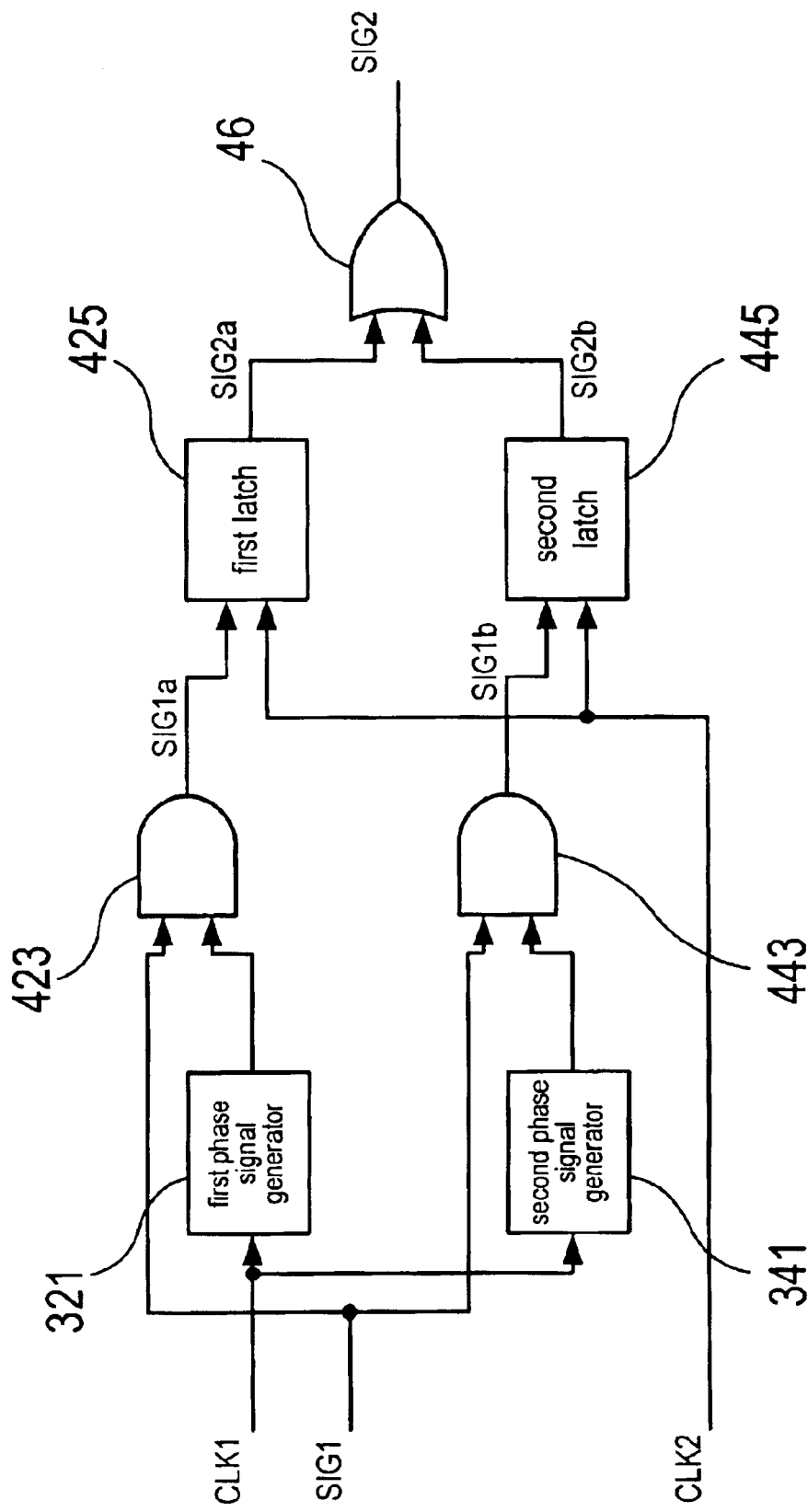
FIG. 4 shows a block diagram of another preferred embodiment of the present invention.
Figure 5:
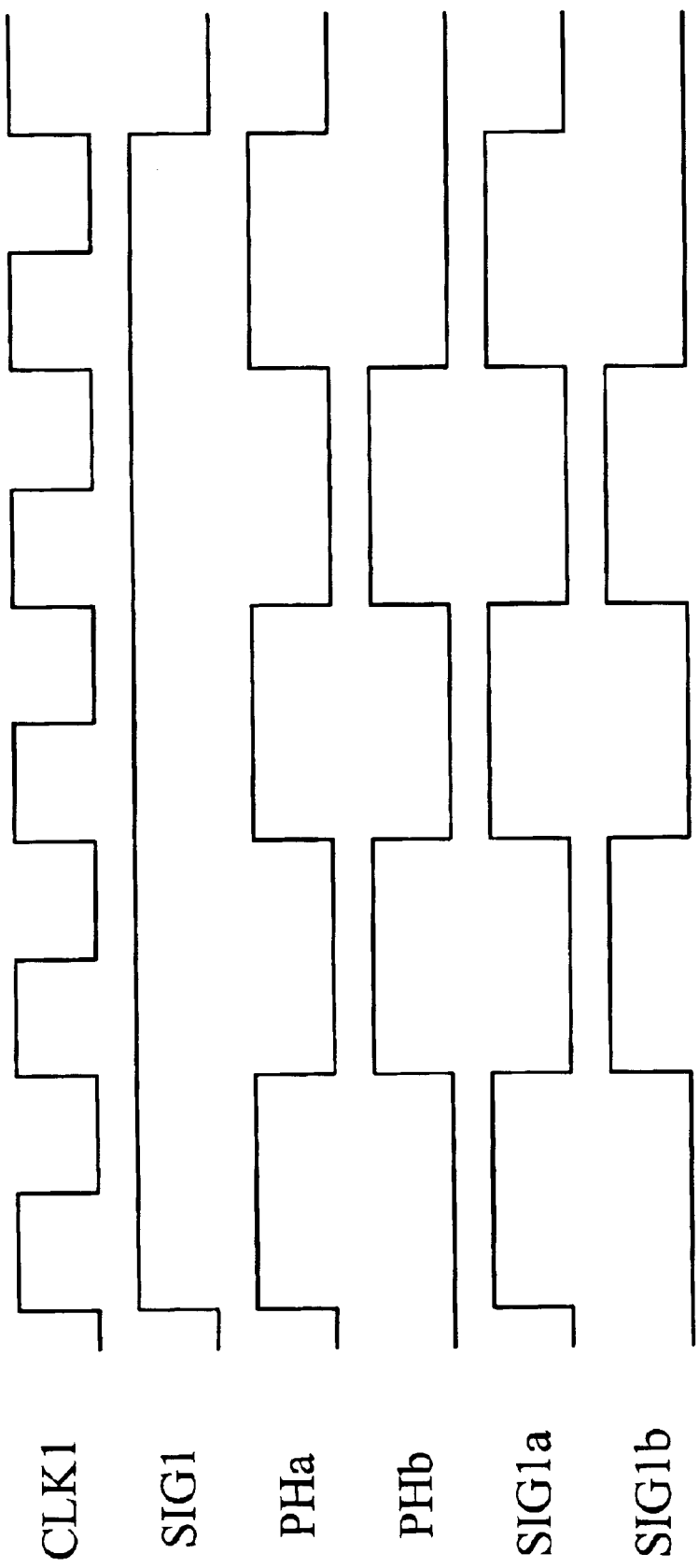
FIG. 5 is a waveform diagram showing the decomposition for the burst signal.
Figure 6:
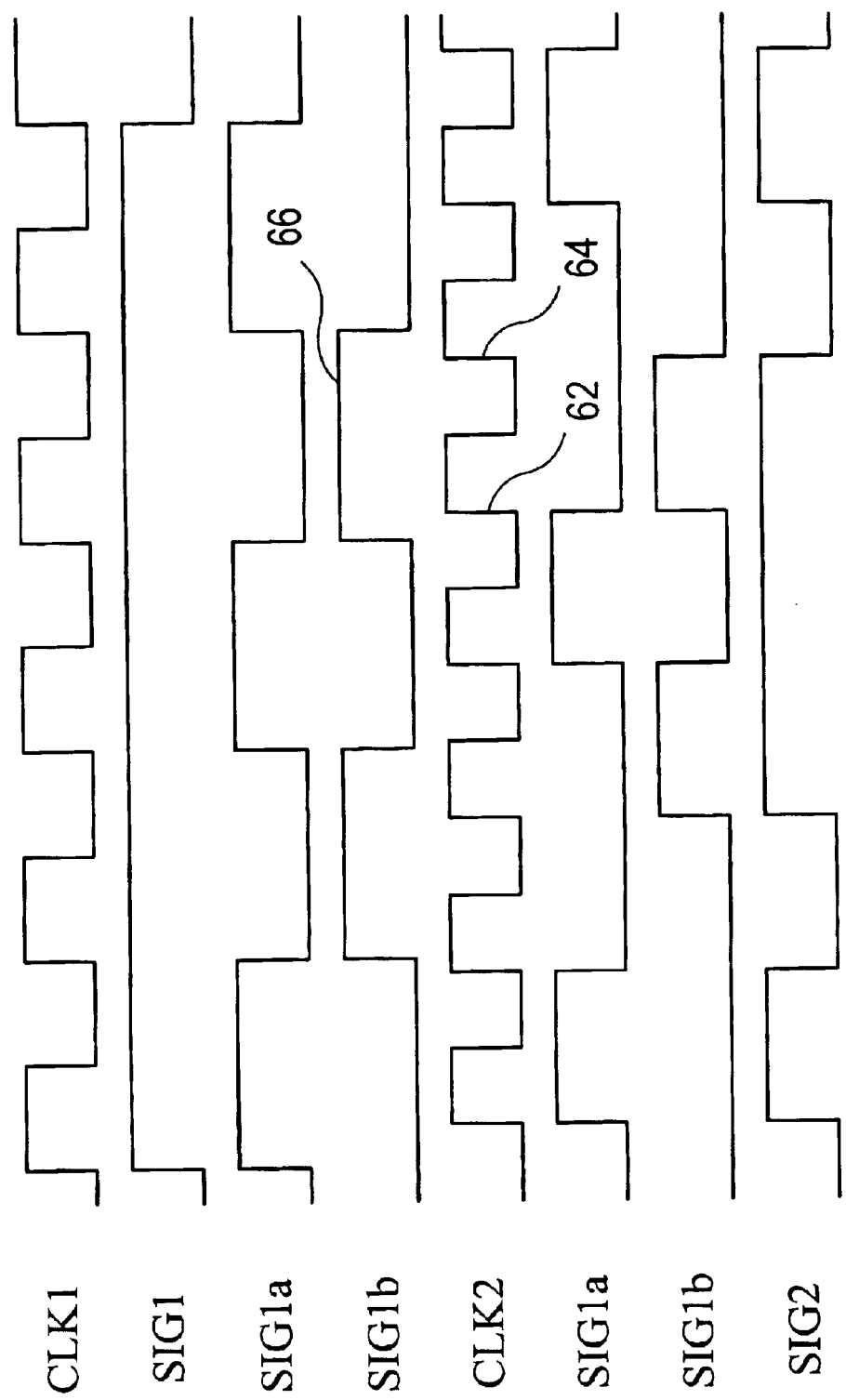
FIG. 6 is a waveform diagrams showing the conversion for the burst signal.

FIG. 4 shows a block diagram of another preferred embodiment of the present invention. FIG. 5 and FIG. 6 are waveform diagrams showing the decomposition and conversion for the burst signal. More particularly, part of components in the conversion circuit shown in FIG. 3 can be replaced by simple logic units when the frequency of the second clock is higher than the frequency of the first clock. The circuit elements shown in FIG. 4 are similar to those in FIG. 3 except that the first signal fetching unit 323, the second signal fetching unit 343 are implemented by two AND gates 423 and 443, the first converter 325 and the second converter 345 are implemented by two latches 425 and 445 and the signal synthesizer 36 is implemented by an OR gate 46.

In this preferred embodiment, the phase signal generated by the first phase signal generator 321 is a periodic signal PHa with cyclic high level and low level as shown in FIG. 5, and the phase signal generated by the second phase signal generator 341 is a periodic signal PHb with cyclic low level and high level as shown in FIG. 5. Therefore, the burst signal SIG1 referencing to the first clock CLK1 can be decomposed into the first-clock-based first non-burst signal SIG1a and the first-clock-based second non-burst signal SIG1b by the first AND gate 423 and the second AND gate 443.

The first latch 425 and the second latch 445 latch the first non-burst signal SIG1a and the second non-burst signal SIG1b at the rising edge of the second clock CLK2, thus converting the first-clock-based first non-burst signal SIG1aand the first-clock-based second non-burst signal SIG1b into a second-clock-based first non-burst signal SIG2a and a second-clock-based second non-burst signal SIG2b, respectively, as shown in FIG. 6.

More particularly, in this preferred embodiment, the first non-burst signal SIG1a and the second non-burst signal SIG1b may experience two or more consecutive rising edges of the second clock because the frequency of the second clock is higher than the frequency of the first clock. As shown in FIG. 6, a signal 66 of the second non-burst signal SIG1b experiences two consecutive rising edges of the second clock CLK2 and it may cause wrong result for the second-clock-based second non-burst signal SIG2b. It is a criterion that the first latch 425 (the second latch 445) will not sample again the first non-burst signal SIG1a (the second non-burst signal SIG1b) at next rising edge of the second clock CLK2 once the first non-burst signal SIG1a (the second non-burst signal SIG1b) is already sampled.

The second-clock-based first non-burst signal SIG2a and the second-clock-based second non-burst signal SIG2b produced by the first latch 425 and the second latch 445 are combined by the OR gate 46 to synthesize the signal SIG2 referencing to the second clock CLK 2.

In above preferred embodiment, the conversion circuit uses two phase signal generators and two corresponding AND gates. However, the conversion circuit can use more phase signal generators and corresponding AND gates, as long as the pulses representing high-voltage logic state and generated by those phase signal generators are cyclic and complementary to each other.

To sum up, the conversion circuit according to the present invention firstly decomposes a burst signal referencing to a first clock into a plurality of non-burst signals, the plurality of non-burst signals are then converted to non-burst signals referencing to a second clock and then synthesized to a signal SIG2 referencing to a second clock.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A conversion circuit for converting burst signal referencing to a plurality of clocks including at least a first clock and a second clock, the conversion circuit comprising
    a plurality of phase signal generators, each of the phase signal generators receiving signals of said first clock at an input end thereof and generating a phase signal;
    a plurality of signal fetching units with number corresponding to that of said phase signal generators, each of said signal fetching units having one input for receiving a burst signal referencing to said first clock and another input connected to said corresponding phase signal generator for receiving a phase signal;
    a plurality of converters with number corresponding to that of said signal fetching units, each of said converters having one input for receiving signals of said second clock and another input for receiving an output signal of said corresponding signal fetching unit; and
    a signal synthesizer having a plurality of input ends connected to respective output of said corresponding converter for combining the output signals from said converters into a signal referencing to said second clock.

2. The conversion circuit as recited in claim 1, wherein each of said phase signal generators generates phase signals with one cycle of high-voltage logic state and at least one cycle of low-voltage logic state in cyclic manner.

3. The conversion circuit as recited in claim 2, wherein only one phase signal from those phase signal generators is in high-voltage logic state during one cycle of said first clock.

4. The conversion circuit as recited in claim 2, wherein each of said signal fetching units fetches said burst signal referencing to said first clock when corresponding phase signal generator generates a signal in high-voltage logic state.

5. The conversion circuit as recited in claim 2, wherein each of said signal fetching units is an AND gate.

6. The conversion circuit as recited in claim 1, wherein each of said converters is a latch.

7. The conversion circuit as recited in claim 6, wherein each of said latchs samples said output signal of said corresponding signal fetching unit with reference to said second clock.

8. The conversion circuit as recited in claim 1, wherein said signal synthesizer is an OR gate.

9. The conversion circuit as recited in claim 1, wherein said second clock has a frequency higher than that of said first clock.

10. A method for converting burst signal referencing to at least two clocks, said method comprising the steps of:

provoiding a first clock and a second clock;

providing a burst signal referencing to said first clock;

decomposing said burst signal into a plurality of non-burst signals;

converting said plurality of non-burst signals into signals referencing to said second clock; and synthesizing said non-burst signals referencing to said second clock into an output signal.

11. The method as recited in claim 10, wherein the step of decomposing said burst signal into a plurality of non-burst signals comprises following sub-steps:

providing a plurality of phase signal generators and a plurality of signal fetching units with number corresponding to that of said phase signal generators;

generating a plurality of phase signals from said plurality of phase signal generators and sending said plurality of phase signals to corresponding signal fetching units;

fetching said burst signal referencing to said first clock by said signal fetching units with reference to corresponding phase signal.

12. The method as recited in claim 11, wherein each of said phase signal generators generates phase signals with one cycle of high-voltage logic state and at least one cycle of low-voltage logic state in cyclic manner.

13. The method as recited in claim 12, wherein only one phase signal from said phase signal generators is in high-voltage logic state during one cycle of said first clock.

14. The method as recited in claim 12, wherein each of said signal fetching units is an AND gate.

15. The method as recited in claim 10, wherein each of said converters is a latch.

16. The method as recited in claim 15, wherein each of said latchs samples corresponding non-burst signals with reference to said second clock.

17. The method as recited in claim 16, wherein each of said latchs samples corresponding non-burst signal at rising edge of said second clock.

18. The method as recited in claim 17, wherein each of said latchs does not sample corresponding non-burst signal at next cycle of second clock once said non-burst signal is latched.

19. The method as recited in claim 10, wherein the step of synthesizing said signals referencing to said second clock into an output signal comprises following sub-steps:

providing a signal synthesizer; and synthesizing said signals referencing to said second clock into said output burst signal by said signal synthesizer.

20. The method as recited in claim 19, wherein said synthesizer is an OR gate.

21. The method as recited in claim 10, wherein said second clock has a frequency higher than that of said first clock.

* * * * *